(12) United States Patent  
Oh

(10) Patent No.: US 8,797,811 B2
(45) Date of Patent: Aug. 5, 2014

(54) METHOD AND APPARATUS TO REDUCE POWER CONSUMPTION BY TRANSFERRING FUNCTIONALITY FROM MEMORY COMPONENTS TO A MEMORY INTERFACE

(75) Inventor: Jong-Hoon Oh, Chapel Hill, NC (US)

(73) Assignee: Qimonda AG, Munich (DE)

( * ) Notice: Subject to any disclaimer, the term of this patent is extended or adjusted under 35 U.S.C. 154(b) by 785 days.

(21) Appl. No.: 12/273,348

(22) Filed: Nov. 18, 2008

(65) Prior Publication Data

US 2010/0124130 A1    May 20, 2010

(51) Int. Cl.
*G11C 7/00*    (2006.01)
*G11C 7/10*    (2006.01)
*H03L 7/081*    (2006.01)
*G11C 7/22*    (2006.01)
*G11C 8/18*    (2006.01)

(52) U.S. Cl.
CPC ............... *G11C 8/18* (2013.01); *G11C 7/1066* (2013.01); *G11C 2207/2227* (2013.01); *H03L 7/0812* (2013.01); *G11C 7/22* (2013.01); *G11C 7/1051* (2013.01); *G11C 7/225* (2013.01)
USPC ......................................................... 365/193

(58) Field of Classification Search
USPC .......................................................... 365/193
See application file for complete search history.

(56) References Cited

U.S. PATENT DOCUMENTS

| 7,345,931 | B2 * | 3/2008 | Partsch et al. | 365/189.09 |
| 2007/0069774 | A1 * | 3/2007 | Kim et al. | 327/158 |
| 2009/0116313 | A1 * | 5/2009 | Jang | 365/194 |

* cited by examiner

*Primary Examiner* — Anthan Tran
(74) *Attorney, Agent, or Firm* — Murphy, Bilak & Homiller, PLLC

(57) ABSTRACT

A common Delay Locked Loop (DLL) circuit and/or voltage generator circuit is provided in, or associated with, a memory interface interposed between a memory controller and a plurality of memory components. Corresponding circuits in the memory components are disabled and/or bypassed, or the memory components are manufactured without the circuits. Both the DLL circuit and voltage generator draw current, which is multiplied by the number of memory components in a memory system. By operating a single DLL circuit and/or voltage generator in or associated with the memory interface, that generates a read clock signal and/or various voltage levels, respectively, for all memory components in the memory system, power consumption may be significantly reduced.

8 Claims, 6 Drawing Sheets

METHOD AND APPARATUS TO REDUCE POWER CONSUMPTION BY TRANSFERRING FUNCTIONALITY FROM MEMORY COMPONENTS TO A MEMORY INTERFACE

BACKGROUND

The present invention relates generally to synchronous memory systems, and in particular to a memory interface that reduces overall memory system power consumption by incorporating functionality from SDRAM components.

Synchronous Dynamic Random Access Memory (SDRAM) components are widely deployed as the technology implementing main memory storage in a wide variety of computing systems, including portable devices. One or more memory controllers, such as a microprocessor, Digital Signal Processor (DSP), Direct Memory Access (DMA) engine, or the like, directs memory read and write requests to, typically, a plurality of SDRAM components. To reduce system bus loading, accommodate different bus architectures, provide configurability, improve performance by buffering data, off-load refresh overhead and/or error correction processing from a processor, and for other reasons, a memory interface is often interposed between the memory controller(s) the SDRAM components.

FIG. 1 depicts a representative synchronous memory system, denoted generally by the numeral 8. The memory system 8 includes a memory controller 10 and a plurality of SDRAM components 12. Interposed between the memory controller 10 and the SDRAM components 12 is a memory interface 14. The memory interface 14 receives memory access requests from one or more memory controllers 10 across a system bus 16, which may for example include a system clock signal, a plurality of command signals, and address and data buses. The memory interface 14 is operative to perform read and write (and refresh) operations on the SDRAM components 12 across a memory bus 18. The memory bus 18 may include, as depicted in FIG. 1, a memory clock signal, an integrated control and address bus, a data bus (DQ), and a plurality of data strobe (DQS) signals. In general, the system bus 16 and the memory bus 18 may differ in organization, protocol, and/or timing. For example, the memory bus 18 may be matched to the Input/Output (I/O) of the SDRAM components 12, while the system bus 16 may be matched to a particular memory controller 10 or may otherwise be optimized for the data transfer constraints of a particular system design. Thus, one function of the memory interface 14 is to "bridge" the system bus 16 and memory bus 18. In some implementations, the memory interface 14 may additionally buffer data, further decoupling the two buses 16, 18.

In some embodiments, the memory interface 14 and plurality of SDRAM components 12 may be physically and electrically associated as a module 20. The Fully-Buffered Dual In-line Memory Module (FB-DIMM) is one example of such a memory module 20. Within the FB-DIMM, the Advanced Memory Buffer (AMB) is an example of a memory interface 14. The memory interface 14 and SDRAM components 12 may also be integrated into a Multi-Chip Package (MCP), wherein a plurality of integrated circuit (IC) die are included in one IC package. Of course, the memory system 8 may also be implemented as discrete components. No matter how they are packaged, the number of SDRAM components 12 may range from a few to a few hundred.

As further depicted in FIG. 1, the memory controller 10 includes a clock generation circuit 11 generating and distributing a system clock signal. In other embodiments, both the memory controller 10 and the memory interface 14 may receive a system clock signal from a system clock generator external to the memory controller 10. Data transfers across the system bus 16 are synchronous to the system clock signal.

The memory interface 14 includes a clock driver circuit 22 generating a memory clock signal (MEM CLK), which is distributed to all SDRAM components 12. Each SDRAM component 12 includes a Delay Locked Loop (DLL) 24 generating a read clock signal (R-CLK). A data I/O circuit 26 uses the read clock signal to synchronize data on the DQ bus and DQS strobe signals to memory clock signal edges in burst memory transfers.

FIG. 2 depicts read burst timing on the memory bus 18 for the memory system 8 depicted in FIG. 1. The memory interface 14 places a read command on the bus 18, via an encoding of command signals, and provides a read address. Following a programmed CAS latency (CL), an addressed SDRAM component 12 transfers four DQ-bus-width words of data (D0-D3) in a burst transfer, the transitions of which, and those of the DQS strobes (not shown), are aligned to memory clock signal edges. The burst read data are received by an I/O circuit 28 in the memory interface 14 (FIG. 1), and may be buffered or immediately passed on to the memory controller 10.

Each SDRAM component 12 also includes a Voltage Generator circuit 30, which generates a plurality of different voltage levels for use by circuits internal to the SDRAM component 12. For example, the DRAM array, sense amps, I/O driver circuits, digital control logic, and/or other circuits may all require different operating voltages. The generation and distribution of these different voltages is an internal function of the SDRAM component 12, and is generally transparent to the system designer.

A memory system 8—or module 20, if so organized—may include from a few to a few hundred SDRAM components 12, depending on their density and speed (and hence cost), and various system design constraints, such as available space, power, heat dissipation capability, weight limitation, and the like. One design constraint of particular criticality to portable electronic devices is power consumption. Portable devices are typically powered by batteries, which are either rechargeable or replaceable. The desire for long operative use periods between battery recharge cycles (or replacements), small size, low weight, and a low heat dissipation capacity due to the lack of cooling fans, combine to place a high cost on power consumption in portable electronic devices. As the number of SDRAM components 12 in a particular design increases, even relatively small per-SDRAM power savings can add up to a significant overall system-wide power savings.

SUMMARY

According to the methods and apparatus taught herein, a common Delay Locked Loop (DLL) circuit and/or voltage generator circuit is provided in, or associated with a memory interface interposed between a memory controller and a plurality of SDRAM components. Corresponding circuits in the SDRAM components are disabled and/or bypassed, or the SDRAM components are manufactured without the circuits. Both the DLL circuit and voltage generator draw current, which is multiplied by the number of SDRAM components in a memory system. By operating a single DLL circuit and/or voltage generator in or associated with the memory interface, that generates a read clock signal and/or various voltage levels, respectively, for all SDRAM components in the memory system, power consumption may be significantly reduced.

Of course, the present invention is not limited to the above features and advantages. Those skilled in the art will recognize additional features and advantages upon reading the following detailed description, and upon viewing the accompanying drawings.

DETAILED DESCRIPTION

According to various embodiments disclosed and claimed herein, some circuits in conventional synchronous memory components that consume power—such as DLL circuits and/or voltage generating circuits—are disabled and/or bypassed on the memory components, or memory components are manufactured without these circuits. These circuits disabled on or removed from the memory components are provided in, or associated with, a memory interface function. These circuits provide resources, such as a read clock signal or various voltage levels, to a plurality of memory components. Significant power savings may result by reducing or eliminating the duplication of these active circuits in many memory components.

Figure 3:
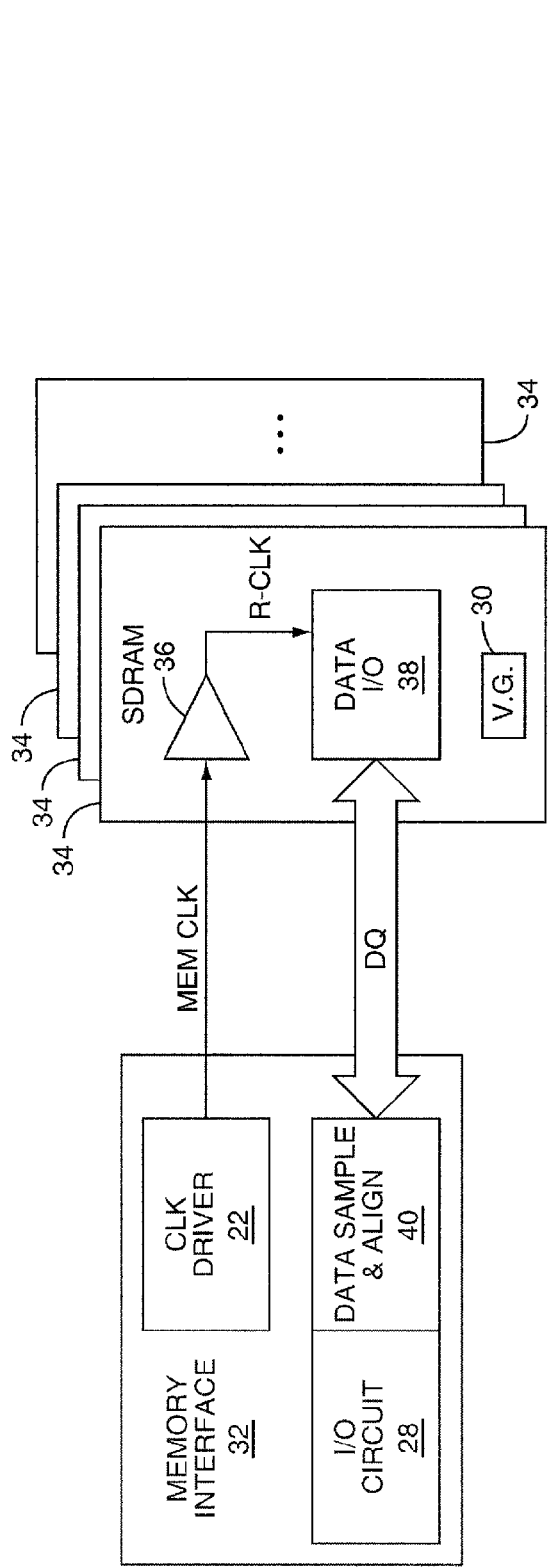
FIG. 3 is a functional block diagram depicting SDRAM components without a DLL circuit.

FIG. 3 depicts a portion of a memory system 8 including a memory interface 32 and a plurality of memory components 34 wherein the memory components 34 are manufactured without a DLL circuit. The memory interface 32 includes a clock driver circuit 22 that generates a memory clock signal (MEM CLK). The memory clock signal is buffered by a clock buffer 36 on the memory component, the output of which is used as the read clock signal (R-CLK) by a data I/O circuit 38. The data I/O circuit 38 outputs burst read data on the DQ bus, which are aligned with data strobe signals DQS (not shown). The memory interface 32 additionally includes a data sample and alignment circuit 40 operative to sample data on the DQ bus using the DQS strobes, and to align the data with a system clock signal. The clock-aligned data are then forwarded to a conventional I/O circuit 28, for buffering or forwarding to a requesting memory controller.

Figure 4:
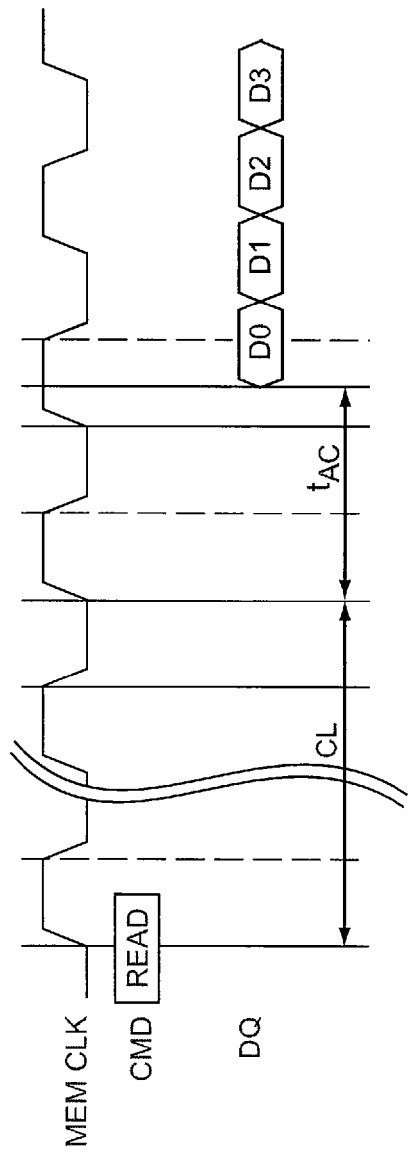
FIG. 4 is a timing diagram of a memory burst read operation associated with the memory system of FIG. 3.

FIG. 4 is a timing diagram depicting a read burst operation between the memory interface 32 and a memory component 34. The memory interface 32 places a read command on the bus, via an encoding of command signals, and provides a read address. Following a programmed CAS latency (CL) and the DQ output access time from a clock edge, specified as tAC in SDRAM data sheets, an addressed memory component 34 transfers four DQ-width words of data (D0-D3) in a burst transfer, the transitions of which are aligned to DQS strobes (not shown), but are not necessarily aligned to memory clock signal edges. Clock-edge alignment occurs in the data sampling and alignment circuit 40 in the memory interface 32.

Figure 5:
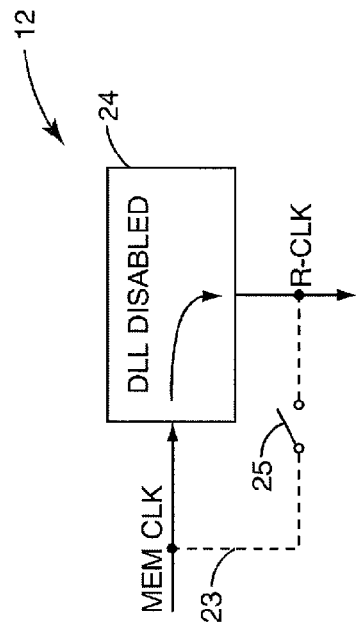
FIG. 5 is a functional block diagram depicting disabling or bypassing a DLL circuit.

FIG. 5 depicts an alternative embodiment of a memory component 12, which includes a DLL circuit 24 that is disabled. The memory clock signal may pass directly through the disabled the DLL circuit 24, in lieu of the clock buffer 36 depicted in FIG. 3, and be output as a read clock signal. Alternatively, the DLL circuit 24 may be bypassed, as shown by a dashed-line bypass path 23 and switch 25. By eliminating (FIG. 3) or disabling/bypassing (FIG. 5) the DLL circuits 24 on the memory components 12, 34, the incremental power consumption associated with each DLL circuit 24 is eliminated, at the cost of a slight additional delay (tAC, see FIG. 4) and a data sampling and alignment circuit 40. If, for example, each DLL circuit 24 consumes 10 mA, the embodiments of FIGS. 3 and 5 may represent a current reduction of 2.56 A in a design incorporating 256 memory components 12, 34.

Figure 6:
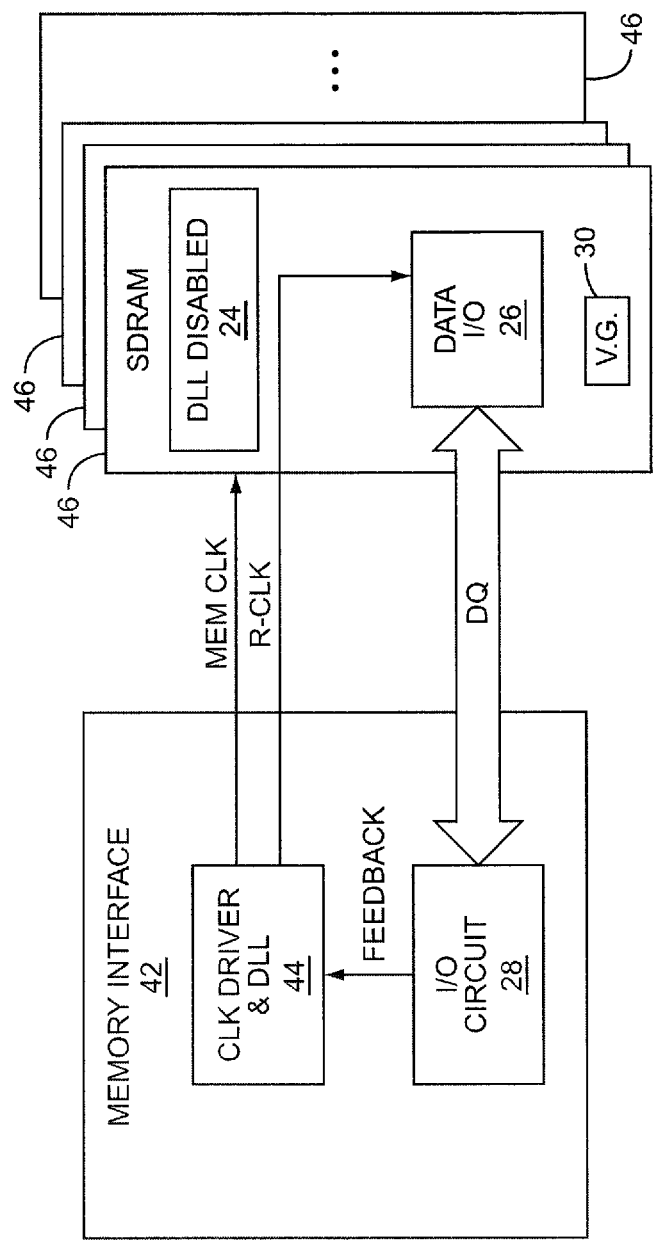
FIG. 6 is a functional block diagram depicting a memory interface having a DLL circuit and providing a read clock signal to SDRAM components.

FIG. 6 depicts a portion of a memory system 8 including a memory interface 42 and a plurality of memory components 46. The memory interface 42 includes a combined clock driver and DLL circuit 44 generating both a memory clock signal (MEM CLK) and a common SDRAM read clock signal (R-CLK). Both clock signals are distributed to the plurality of memory components 46. On each memory component 46, if a DLL circuit 24 exists, it is disabled. The memory clock signal received by the memory component 46 may drive various synchronous circuits, such as control logic (not shown). The memory component 46 directs the received read clock signal to a conventional data I/O circuit 26, and aligns read data burst word transitions on the DQ bus and DQS strobe signals to R-CLK edges. The synchronous read data are read from the DQ bus by a conventional I/O circuit 28 in the memory interface 42.

The I/O circuit 28 outputs a timing feedback signal to the clock driver and DLL circuit 44 to establish a closed-loop timing path for the DLL. The DLL maintains synchronicity by adjusting the delay in a loop from the clock driver and DLL circuit 44, across the R-CLK signal of the memory bus 18, through the data I/O circuit 26 on the memory component 46, back across the DQ bus, and through the I/O circuit 28.

Figure 1:
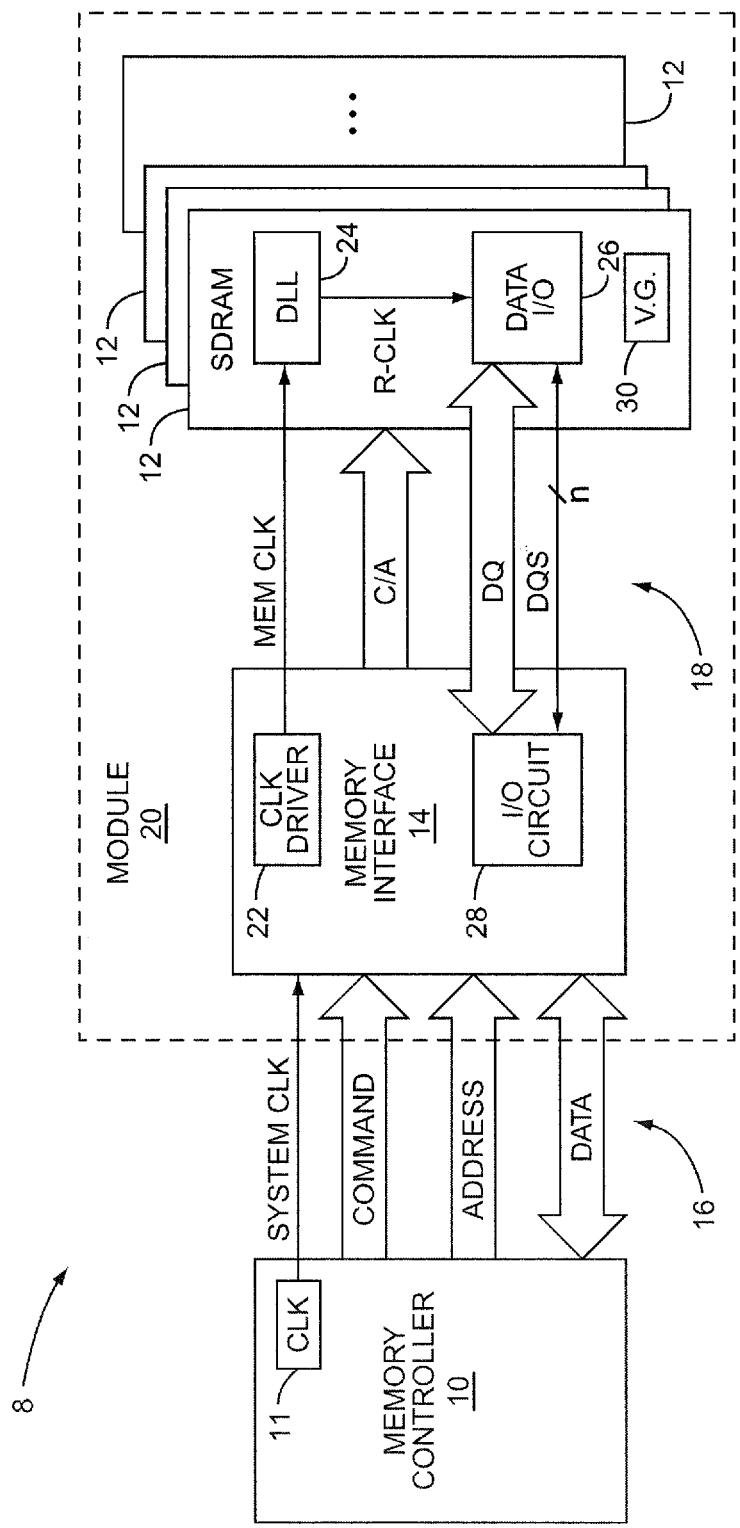
FIG. 1 is a functional block diagram of a prior art memory system.
Figure 2:
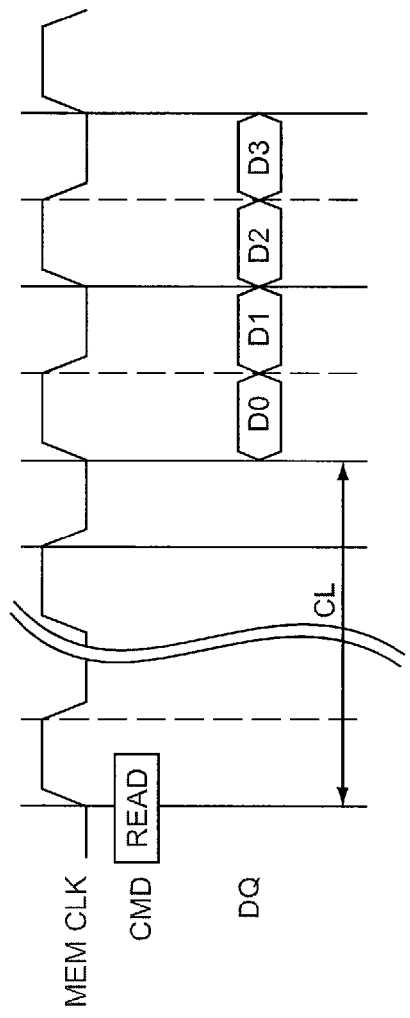
FIG. 2 is a timing diagram of a synchronous memory burst read operation.

FIG. 2 depicts read burst timing on the memory bus 18 for the embodiment depicted in FIG. 6. Those of skill in the art will recognize that the timing is identical to the timing of a read burst in a conventional memory system 8, such as that depicted in FIG. 1. Accordingly, the timing diagram is not discussed in detail.

Another power sink, which is replicated in every memory component 12 in a memory system, is a voltage generator circuit 30. The voltage generator circuit 30 generates a plurality of different voltage levels, and distributes them to various circuits internal to the memory component 12. While each voltage generator circuit 30 may consume a relatively small amount of power, the power consumption becomes significant when a large number of memory components 12 are incorporated into the design of a memory system 8.

Figure 7:
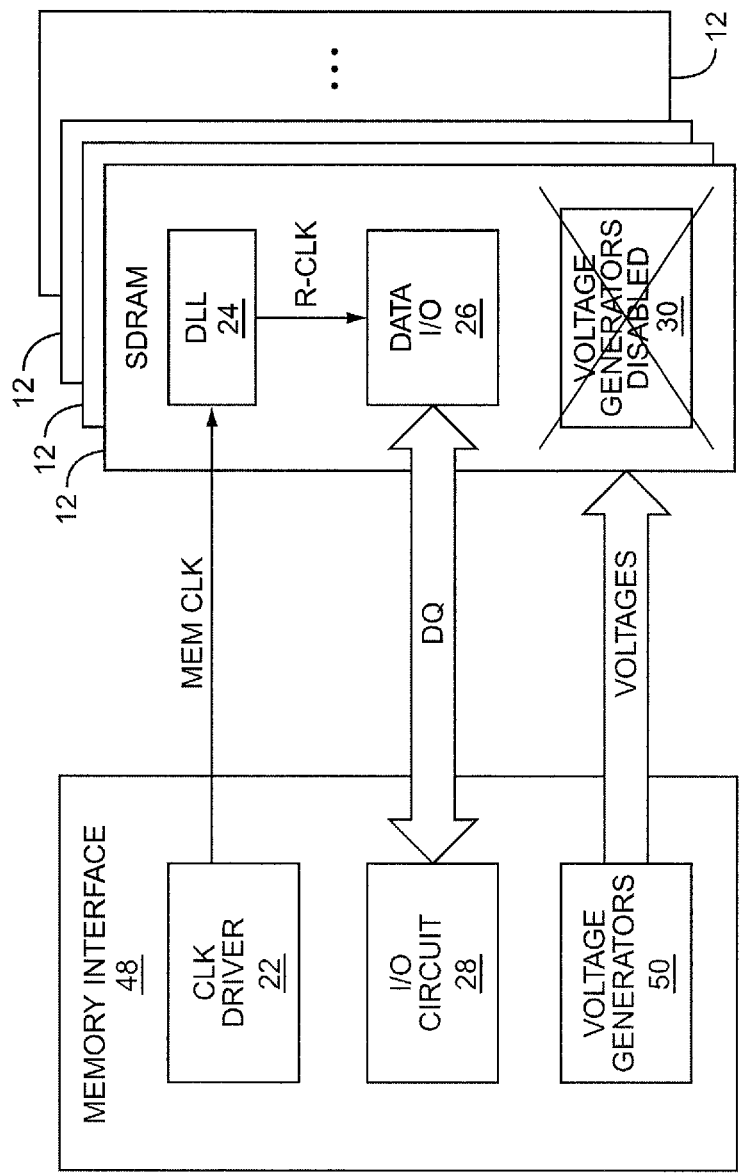
FIG. 7 is a functional block diagram depicting a memory interface having a voltage generator circuit and providing voltage levels to SDRAM components.

According to one embodiment, depicted in FIG. 7, the voltage generator circuit 30 on each memory component 12 is disabled, and a common voltage generator circuit 50 is included in a memory interface 48. The common voltage generator circuit 50 generates all necessary voltage levels, and distributes them to all memory components 12 in the memory system 8. Although the memory components 12 are depicted as conventional SDRAMs with the voltage generator circuit 30 disabled, some modification of a conventional memory component 12 may be necessary, such as providing various voltage level input connections. Additionally, the depicted embodiment obviously also contemplates the manufacture of memory components without any voltage generator circuit 30.

FIG. 7 depicts an otherwise conventional memory interface 48, including a clock driver circuit 22 generating a memory clock (MEM CLK) for distribution to conventional memory components 12. Each memory component 12 includes a DLL circuit 24 generating a read data clock signal (R-CLK), as discussed above. However, those of skill in the art will readily recognize that the common voltage generator circuit 50 in the memory interface 48, with the voltage generator circuits 30 in individual memory components 12 disabled, may be incorporated with any of the read data timing control embodiments described herein, such as those depicted in FIGS. 3, 5, and 6.

Figure 8:
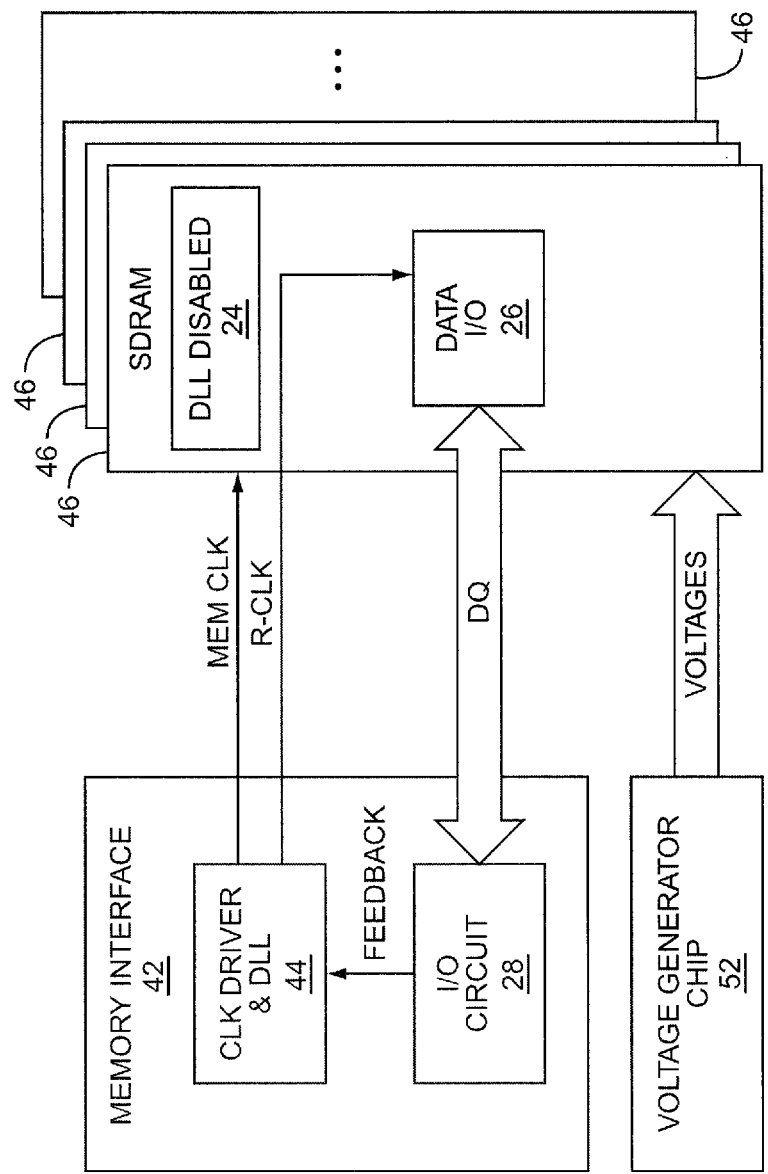
FIG. 8 is a functional block diagram depicting a voltage generator circuit separate from but associated with a memory interface.

Particularly in embodiments where the memory interface 42 comprises all or part of an ASIC, FPGA, a die on an MCP, or the like, the need for analog circuits in the common voltage generator functionality, active components such as capacitors and inductors not easily fabricated in digital ICs, separate supply voltages and ground planes, and the like, may make integration of the common voltage generator circuit 50 within the memory interface 42 problematic or costly. In this case, the voltage generator function may be implemented on a separate die or separately packaged IC. FIG. 8 depicts a voltage generator chip 52 separate from, but associated with, the memory interface 42, and operative to provide various voltages to a plurality of memory components 46. In the embodiment depicted in FIG. 8, the memory components 46 are manufactured without voltage generator circuits 30. In another embodiment, if voltage generator circuits 30 are present in the memory components 46, they are disabled.

In the embodiment depicted in FIG. 8, the memory interface 42 and memory components 46 employ the read data timing control of the embodiment described above with reference to FIG. 6—that is, the DLL functionality resides in the memory interface 42, with DLL circuits 24, if present in the memory components 46, disabled. This demonstrates that any of the read data timing control embodiments described herein may be advantageously combined with any of the common voltage generator functionality embodiments described herein, to effect power savings and otherwise optimize the memory system 8 according to the constraints of any particular system design.

By disabling, bypassing, or removing functionality, such as DLL and/or voltage generation, from each of a plurality of memory components, providing the functionality in or associated with a memory interface, and distributing the clock and/or voltages to the memory components, significant power savings may be realized with minimal or no performance impact or cost increase. In fact, by manufacturing memory components without internal DLL and/or voltage generator circuits, the cost of these components may be reduced, or the silicon area made available may be dedicated to increasing the memory density, thus reducing overall system cost.

As used herein, the term "memory component" refers to an individual, functional synchronous memory device such as SDRAM, including DDR, DDR2, and all other variations. A memory component may be a discrete component, an individually packaged component provided on a carrier such as a FB-DIMM, or an integrated circuit die in a MCP application. In any of the embodiments depicted herein, the functionality (e.g., DLL or voltage generation) moved to or associated with the memory interface may be disabled and/or bypassed on the memory component, or the memory component may be manufactured without the functionality. Those of skill in the art will readily recognize that some straightforward modification may be required to implement embodiments of the present invention on what are described herein as "conventional memory components." For example, connectors may need to be added to accept externally-generated voltage levels, mode selection for disabling circuits or selecting bypass paths, clock signals, and the like. Such modifications are well within the capabilities of those of ordinary skill in the art, and are not explicated herein. In describing embodiments of the present invention, reference has been made to "all" memory components and "each" memory component. While it is contemplated that all memory components in a memory system will be treated similarly, those of skill in the art will realize that embodiments of the present invention may be advantageously applied to some subset of the memory components in a given memory system, and the identifiers "all," "each," and the like are in all instances illustrative and not limiting.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of performing a memory read operation by a memory interface interposed between a memory controller and a plurality of memory components, comprising:
   receiving a synchronous read command from the memory controller;
   performing a read operation on a memory component having thereon a Delay Locked Loop (DLL) circuit that is disabled so that a memory clock signal generated by the memory interface passes directly through the disabled DLL circuit or bypassed so that the memory clock signal is redirected around the bypassed DLL circuit during the read operation, and receiving data and a data strobe signal, the data aligned to the data strobe signal, the memory component also having a functioning voltage generator circuit that is bypassed or disabled during the read operation;
   synchronously transferring the received data to the memory controller; and
   generating two or more voltages by a voltage generating circuit associated with the memory interface and connected to the plurality of memory components.

2. A synchronous memory system, comprising:
   a system clock generator circuit;
   a memory controller operative to issue a synchronous read request;
   a plurality of memory components, each having a functioning Delay Locked Loop (DLL) circuit and a functioning voltage generator circuit both of which are disabled or bypassed;
   a memory interface interposed between the memory controller and the plurality of memory components, the memory interface receiving the system clock signal and operative to receive the synchronous read request from the memory controller;
   perform a read operation on a memory component;
   receive data and a data strobe signal from the memory component, the data aligned to the data strobe signal; and
   synchronously transfer the received data to the memory controller; and a voltage generating circuit associated with the memory interface and connected to the plurality of memory components, the voltage generating circuit operative to generate two or more voltages.

3. The system of claim 2 wherein the voltage generating circuit is included in the memory interface.

4. The system of claim 2 wherein one or more memory components comprise SDRAM components.

5. The system of claim 2, wherein the memory interface includes a data capture and synchronization circuit operative to sample received data using the received data strobe signal, and further operative to synchronize the received data to the system clock prior to transferring the received data to the memory controller.

6. A synchronous memory system, comprising:
   means for outputting a system clock signal;
   means for issuing a synchronous read request;
   storage means for storing data, the storage means having thereon a Delay Locked Loop (DLL) circuit and a functioning voltage generator circuit both of which are disabled or bypassed during read operations;
   means for interfacing the read request means to the storage means, the interface means receiving the system clock signal and operative to receive the synchronous read request from the read request means;
   perform a read operation on the storage means;
   receive data and a data strobe signal from the storage means, the data aligned to the data strobe signal; and
   synchronously transfer the received data to the read request means;
   means for generating two or more voltages,
   wherein a memory clock signal is passed directly through each of the disabled DLL circuits or is redirected around each of the bypassed DLL circuits.

7. The system of claim 6 wherein the read request means includes the clock generator means.

8. The system of claim 6 wherein the interface means comprises means for sampling the received data with the data strobe and aligning the data to the system clock signal prior to synchronously transferring the received data to the read request means.

* * * * *